United States Patent [19]
Yamaguchi et al.

[11] Patent Number: 5,874,853
[45] Date of Patent: *Feb. 23, 1999

[54] SEMICONDUCTOR INTEGRATED CIRCUIT SYSTEM

[75] Inventors: Shusaku Yamaguchi; Atsushi Hatakeyama; Masato Takita; Tadao Aikawa; Hirohiko Mochizuki, all of Kawasaki, Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 863,356

[22] Filed: May 27, 1997

[30] Foreign Application Priority Data

Dec. 20, 1996 [JP] Japan ................................. 8-341867

[51] Int. Cl.$^6$ ....................................................... H03L 7/00
[52] U.S. Cl. ........................... 327/545; 327/143; 327/530; 365/189.05; 307/85
[58] Field of Search ................................. 351/18, 43, 85, 351/86; 365/189.05, 230.08; 327/143, 544, 545, 530; 326/80

[56] References Cited

U.S. PATENT DOCUMENTS

| | | | |
|---|---|---|---|
| 5,333,162 | 7/1994 | Condreva | 377/20 |
| 5,579,356 | 11/1996 | Chevallier | 377/20 |
| 5,663,917 | 9/1997 | Oka et al. | 327/530 |
| 5,710,741 | 1/1998 | McLaury | 365/226 |
| 5,715,198 | 2/1998 | Braceras et al. | 365/189.05 |

OTHER PUBLICATIONS

IBM Tech Disc Bul. "Regulation circuit for semiconductor memory" vol. 14 No. 1, T L Palfi, Jun. 1971.

*Primary Examiner*—Margaret Rose Wambach
*Attorney, Agent, or Firm*—Nikaido Marmelstein Murray & Oram, LLP

[57] ABSTRACT

A semiconductor integrated circuit system includes a first power line which supplies a first source power voltage, and a second power line which supplies a second source power voltage. A first edge detecting unit outputs a first edge detection signal when a rising edge of the first source power voltage is detected. A second edge detecting unit outputs a second edge detection signal when a rising edge of the second source power voltage is detected. An output unit is connected to the first power line, and outputs data to a data terminal in a data output cycle and sets the data terminal in a high-impedance state in response to the first edge detection signal. An output control unit is connected to the second power line, and controls the output unit in accordance with a read-data signal in the data output cycle, and controls the output unit in response to the second edge detection signal, so that the data terminal is set in the high-impedance state by the output unit.

16 Claims, 4 Drawing Sheets

5,874,853

SEMICONDUCTOR INTEGRATED CIRCUIT SYSTEM

BACKGROUND OF THE INVENTION (1) Field of the Invention

The present invention relates to a semiconductor integrated circuit system which includes a first power terminal for supplying a source power voltage to an output unit of the system, and a second power terminal for supplying a source power voltage to an internal unit of the system other than the output unit.

(2) Description of the Related Art

Recently, microprocessors having high processing speeds have been developed, and there are demands for semiconductor memories which provide high processing speeds in association with the microprocessors. A synchronous dynamic random access memory (which will be called a synchronous DRAM) which provides a high processing speed is also demanded.

The synchronous DRAMs have a first power terminal for supplying source power to output units, and a second power terminal for supplying source power to internal units other than the output units. The source power is supplied to a group of two or four output units and the internal units independently of each other, and the charging and discharging of a great capacitance in some tens of picofarads (pF) is performed at high speeds. This structure of the synchronous DRAMs ensures stable operations of the output units requiring a large current consumption.

Typically, in the synchronous DRAMs, a source power voltage VDDQ supplied to the output units and a source power voltage VDD supplied to the internal units are the same. For example, both the source power voltages VDDQ and VDD are equal to 3.3 volts. However, the source power voltages VDDQ and VDD in some type of the synchronous DRAMs may be different from each other.

A system which utilizes a plurality of the synchronous DRAMs provided therein is known. Data terminals of the synchronous DRAMs are connected in common to an external data bus.

When read-data signals are input to some of the synchronous DRAMs during operation of the above-mentioned system, the data terminals of these synchronous DRAMs drive the external data bus at one of two different voltage levels, and the data terminals of the other synchronous DRAMs are set in a high-impedance state (or the opened condition). This prevents the driving of the external data bus at one of the two voltage levels by the other synchronous DRAMs. Therefore, it is possible to prevent the flow of a large amount of short-circuit current between the synchronous DRAMs through the sharing external data bus.

FIG. 1 shows main elements of a conventional synchronous DRAM. In FIG. 1, reference numeral 1 indicates a data terminal, reference numeral 2 indicates an output unit, and reference numeral 3 indicates a VDDQ power line. The output unit 2 outputs data (DQ) to the data terminal 1. A source power voltage VDDQ (VDDQ=3.3 volts) from the VDDQ power line 3 is supplied to the output unit 2.

In the conventional synchronous DRAM of FIG. 1, an output control unit 4 controls the output unit 2 in accordance with a read-data signal (RD) from a memory core (not shown) of the synchronous DRAM. A source power voltage VDD (VDD=3.3 volts) from a VDD power line 5 is supplied to the output control unit 4.

The source power voltage VDDQ is supplied to the output unit 2. The source power voltage VDD is supplied to the internal units of the conventional synchronous DRAM other than the output unit 2. In the conventional integrated circuit system of FIG. 1, the internal units include the output control unit 4 and a VDD rising edge detecting unit 6.

The source power voltage VDD from the VDD power line 5 is supplied also to the VDD rising edge detecting unit 6. When power is turned on, the VDD rising edge detecting unit 6 detects whether the source power voltage VDD supplied to the internal units other than the output unit 2 is at its rising edge. When the rising edge of the source power voltage VDD is detected, the VDD rising edge detecting unit 6 outputs a detection signal STT (which is set at the high level) to the output control unit 4. In response to this detection signal STT from the VDD rising edge detecting unit 6, the output control unit 4 sets the data terminal 1 of the output unit 2 in the high-impedance state.

In the conventional synchronous DRAM, if the source power voltage VDD supplied to the internal units other than the output unit 2 is detected as being at the rising edge, the data terminal 1 is set in the high-impedance state. This prevents the external data bus from being driven at one of the two voltage levels by the synchronous DRAMs sharing the external data bus. Therefore, it is possible to prevent the flow of a large amount of short-circuit current between the synchronous DRAMs through the sharing external data bus.

However, generally, a rising edge of the source power voltage VDDQ supplied to the output unit 2 and a rising edge of the source power voltage VDD supplied to the internal units other than the output unit 2 does not always occur at the same time. Therefore, there is a situation in which the rising edge of the source power voltage VDDQ occurs prior to the occurrence of the rising edge of the source power voltage VDD.

FIG. 2 shows a problem of the conventional synchronous DRAM of FIG. 1 when the rising edge of the source power voltage VDDQ occurs prior to the occurrence of the rising edge of the source power voltage VDD. As shown in FIG. 2, in the conventional synchronous DRAM, a change in the source power voltage VDDQ is indicated by a solid line in FIG. 2, and a change in the source power voltage VDD is indicated by a dotted line in FIG. 2.

In the conventional synchronous DRAM of FIG. 2, if the rising edge of the source power voltage VDD occurs prior to the occurrence of the rising edge of the source power voltage VDDQ, the data terminal 1 is set in the high-impedance state, and it is possible that the flow of a large amount of short-circuit current between the synchronous DRAMs through the sharing external data bus is prevented.

However, as shown in FIG. 2, if the rising edge of the source power voltage VDDQ occurs prior to the occurrence of the rising edge of the source power voltage VDD, the source power voltage VDDQ from the VDDQ power line 3 is supplied to the output unit 2 before the data terminal 1 is set in the high-impedance state. At this time, the conventional synchronous DRAM has a problem in that the flow of a large amount of short-circuit current between the synchronous DRAMs through the external data bus may occur.

SUMMARY OF THE INVENTION

A general object of the present invention is to provide an improved semiconductor integrated circuit system in which the above-mentioned problems are eliminated.

Another object of the present invention is to provide a semiconductor integrated circuit system which effectively prevents the flow of a large amount of short-circuit current between similar semiconductor integrated circuit systems sharing the external data bus, the power consumption of each semiconductor integrated circuit system can be remarkably reduced.

The above-mentioned objects of the present invention are achieved by a semiconductor integrated circuit system which comprises: a first power line which supplies a first source power voltage; a second power line which supplies a second source power voltage; a first edge detecting unit which outputs a first edge detection signal when a rising edge of the first source power voltage is detected; a second edge detecting unit which outputs a second edge detection signal when a rising edge of the second source power voltage is detected; an output unit, connected to the first power line, which outputs data to a data terminal in a data output cycle and sets the data terminal in a high-impedance state in response to the first edge detection signal; and an output control unit, connected to the second power line, which controls the output unit in accordance with a read-data signal in the data output cycle, and controls the output unit in response to the second edge detection signal, so that the data terminal is set in the high-impedance state by the output unit.

The above-mentioned objects of the present invention are achieved by a semiconductor integrated circuit system which comprises: a first power terminal which supplies a first source power voltage; a second power terminal which supplies a second source power voltage; a first edge detecting unit which outputs an edge detection signal when a rising edge of the first source power voltage is detected by the first edge detecting unit; a second edge detecting unit which outputs an edge detection signal when a rising edge of the second source power voltage is detected by the second edge detecting unit; an output unit which outputs data to a data terminal at a start of a data output cycle, and sets the data terminal in a high-impedance state in response to the edge detection signal from the first edge detecting unit when the first source power voltage is supplied to the output unit and the rising edge of the first source power voltage is detected by the first edge detecting unit; and an output control unit which controls the output unit in accordance with a read-data signal at the start of the data output cycle, and controls the output unit in response to the edge detection signal from the second edge detecting unit when the second source power voltage is supplied to the output control unit and the rising edge of the second source power voltage is detected by the second edge detecting unit, so that the data terminal is set in the high-impedance state by the output unit.

In the semiconductor integrated circuit system of the present invention, if a rising edge of the source power voltage supplied to the output unit occurs prior to the occurrence of a rising edge of the source power voltage supplied to the output control unit upon power-up of the system, the output unit is controlled in response to the edge detection signal from the first edge detecting unit, so that the data terminal is set in the high-impedance state. If a rising edge of the source power voltage supplied to the output control unit occurs prior to the occurrence of a rising edge of the source power voltage supplied to the output unit upon power-up of the system, the output control unit controls the output unit in response to the edge detection signal from the second edge detecting unit, so that the data terminal is set in the high-impedance state by the output unit.

Accordingly, when the power is turned on, the semiconductor integrated circuit system of the present invention can effectively prevent the flow of a large amount of short-circuit current between similar semiconductor integrated circuit systems through the sharing external data bus, even when one of the rising edge of the source power voltage supplied to the output unit and the rising edge of the source power voltage supplied to the output control unit occurs prior to the occurrence of the rising edge of the other source power voltage, so that the power consumption of the semiconductor integrated circuit system can be remarkably reduced.

BRIEF DESCRIPTION OF THE DRAWINGS

The above and other objects, features and advantages of the present invention will become more apparent from the following detailed description when read in conjunction with the accompanying drawings in which.

DESCRIPTION OF THE PREFERRED EMBODIMENTS

A description will now be given of the preferred embodiments of the present invention with reference to the accompanying drawings.

Figure 1:
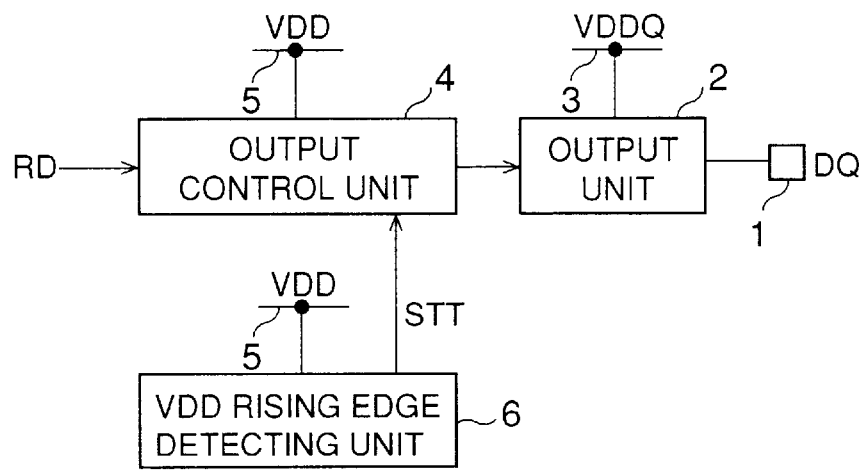
FIG. 1 is a block diagram showing main elements of a conventional synchronous DRAM.
Figure 2:
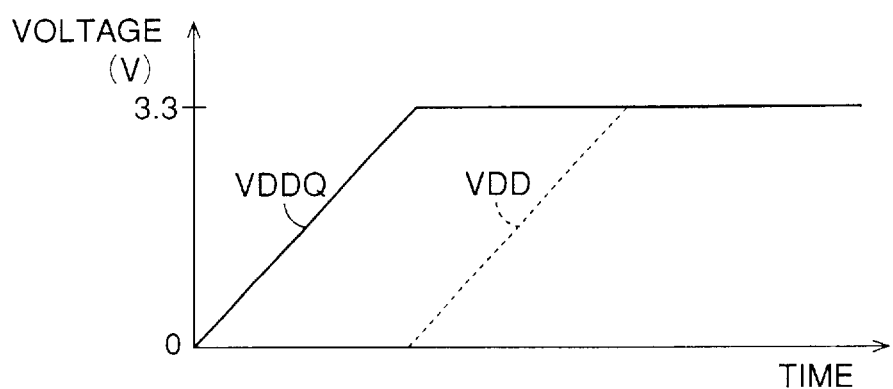
FIG. 2 is a waveform diagram for explaining a problem of the conventional synchronous DRAM of FIG. 1.
Figure 3:
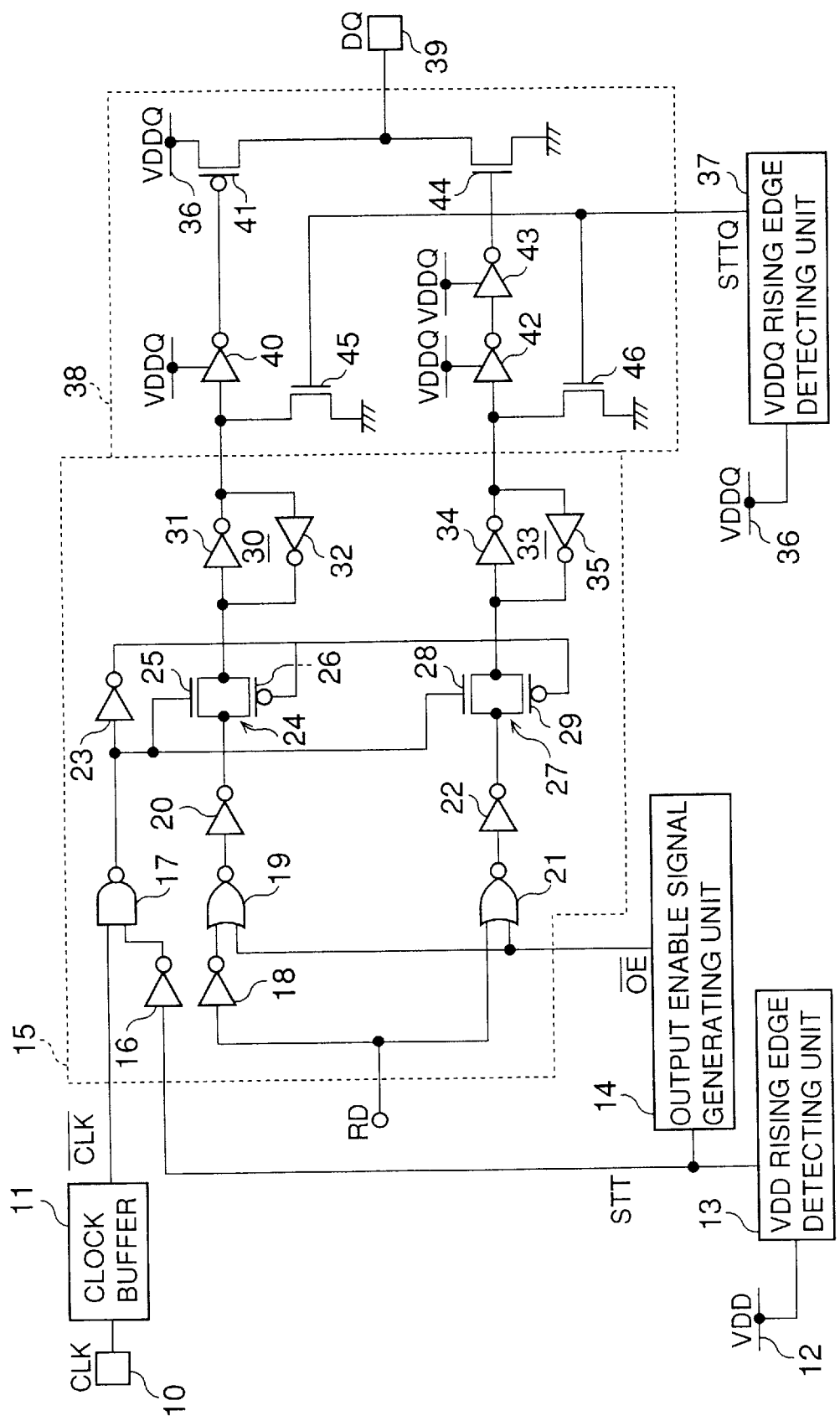
FIG. 3 is a block diagram of a semiconductor integrated circuit system in a first embodiment of the present invention.

FIG. 3 shows a semiconductor integrated circuit system in a first embodiment of the present invention. The present embodiment of the semiconductor integrated circuit system is applied to the synchronous DRAM.

In FIG. 3, reference numeral 10 indicates an external clock terminal for inputting a clock signal (CLK), and reference numeral 11 indicates a clock buffer for converting the clock signal (CLK) from the clock terminal 10 into an inverted clock signal (/CLK) and amplifying the inverted clock signal (/CLK).

In the semiconductor integrated circuit system of FIG. 3, a source power voltage VDD (VDD=3.3 volts) from a VDD power line 12 is supplied to a VDD rising edge detecting unit 13. The source power voltage VDD is a source power voltage externally supplied to the internal units of the semiconductor integrated circuit system other than the output unit thereof. The VDD power line 12 is connected to a power terminal (not shown in FIG. 3) for inputting the source power voltage VDD.

Figure 4:
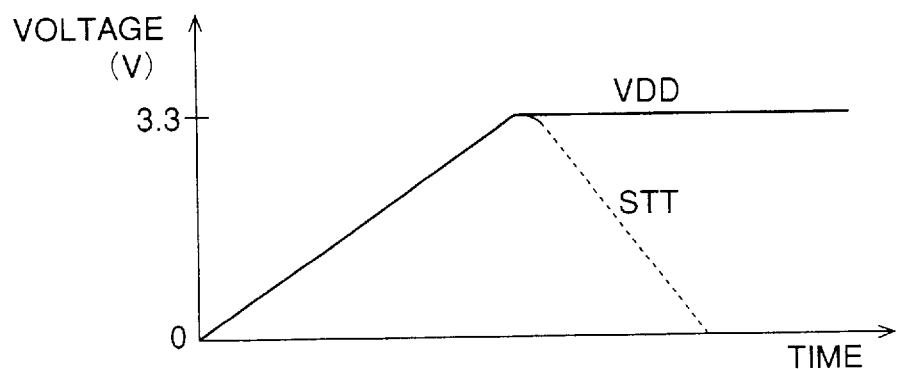
FIG. 4 is a waveform diagram for explaining an operation of an edge detecting unit of FIG. 3.

The VDD rising edge detecting unit 13 outputs an edge detection signal STT in the form of a pulse signal when a rising edge of the source power voltage VDD from the VDD power line 12 is detected by the VDD rising edge detecting unit 13, as shown in FIG. 4.

An output enable signal generating unit 14 generates an output enable signal (/OE) which restricts a data output operation of the semiconductor integrated circuit system. In response to the edge detection signal STT output by the VDD rising edge detecting unit 13 upon power-up of the semiconductor integrated circuit system of the present embodiment, the output enable signal generating unit 14 sets the output enable signal (/OE) at a high level. After this operation, at the start of a data output cycle, the output enable signal generating unit 14 sets the output enable signal (/OE) at a low level in accordance with a read-data signal (RD) from a memory core (not shown) of the synchronous DRAM.

The clock signal (/CLK) from the clock buffer 11 is supplied to an output control unit 15. The output control unit 15 inputs the edge detection signal STT from the VDD rising edge detecting unit 13, the output enable signal (/OE) from the output enable signal generating unit 14, and the read-data signal (RD) from the memory core, as well as the clock signal (/CLK) from the clock buffer 11.

In the output control unit 15, an inverter 16 inverts the edge detection signal STT from the VDD rising edge detecting unit 13. A NAND circuit 17 performs a NAND operation between the clock signal (/CLK) from the clock buffer 11 and the output of the inverter 16. An inverter 18 inverts the read-data signal (RD). A NOR circuit 19 performs a NOR operation between the output of the inverter 18 and the output enable signal (/OE) from the output enable signal generating unit 14. An inverter 20 inverts the output of the NOR circuit 19.

Further, in the output control unit 15, a NOR circuit 21 performs a NOR operation between the read-data signal (RD) and the output enable signal (/OE) from the output enable signal generating unit 14. An inverter 22 inverts the output of the NOR circuit 21. An inverter 23 inverts the output of the NAND circuit 17. A transmission gate circuit 24 includes an n-channel MOSFET 25 and a p-channel MOSFET 26. MOSFET is the abbreviation of metal oxide semiconductor field-effect transistor. The ON/OFF state of the n-channel MOSFET 25 is controlled by the output of the NAND circuit 17. The ON/OFF state of the p-channel MOSFET 26 is controlled by the output of the inverter 23.

Further, in the output control unit 15, a transmission gate circuit 27 includes an n-channel MOSFET 28 and a p-channel MOSFET 29. The ON/OFF state of the n-channel MOSFET 28 is controlled by the output of the NAND circuit 17. The ON/OFF state of the p-channel MOSFET 29 is controlled by the output of the inverter 23. A latch circuit 30 includes an inverter 31 and an inverter 32. The latch circuit 30 latches the output of the inverter 20. A latch circuit 33 includes an inverter 34 and an inverter 35. The latch circuit 33 latches the output of the inverter 22.

In the above-described system of FIG. 3, the source power voltage VDD is supplied to the inverters 16, 18, 20, 22, 23, 31, 32, 34 and 35, the NAND circuit 17, the NOR circuit 19, the NOR circuit 21, and the VDD rising edge detecting unit 13.

Further, in the semiconductor integrated circuit system of FIG. 3, a source power voltage VDDQ (VDDQ=3.3 volts) from a VDDQ power line 36 is supplied to a VDDQ rising edge detecting unit 37.

The source power voltage VDDQ is a source power voltage externally supplied to an output unit 38 of the present embodiment. The VDDQ power line 36 is connected to a power terminal (not shown in FIG. 3) for inputting the source power voltage VDDQ.

Figure 5:
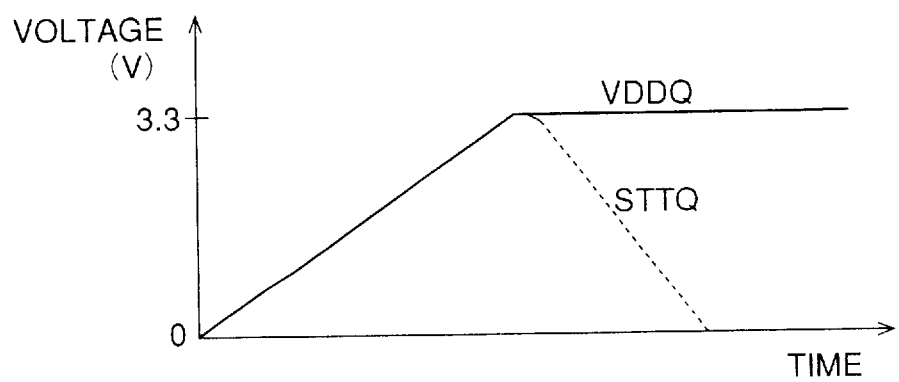
FIG. 5 is a waveform diagram for explaining an operation of another edge detecting unit of FIG. 3.

The VDDQ rising edge detecting unit 37 outputs an edge detection signal STTQ to the output unit 38 when a rising edge of the source power voltage VDDQ from the VDDQ power line 36 is detected by the VDDQ rising edge detecting unit 37, as shown in FIG. 5.

The output unit 38 inputs the output of the latch circuit 30, the output of the latch circuit 33, and the edge detection signal (STTQ) from the VDDQ rising edge detecting unit 37. The output unit 38 outputs the data (DQ) to a data terminal 39 at a start of a data output cycle.

In the output unit 38, an inverter 40 inverts the output of the latch 30. A p-channel MOSFET 41 has a source connected to the VDDQ power line 36, a drain connected to the data terminal 39, and a gate connected to the output of the inverter 40. The ON/OFF state of the p-channel MOSFET 41 is controlled by the output of the inverter 40.

Further, in the output unit 38, an inverter 42 inverts the output of the latch circuit 33. An inverter 43 inverts the output of the inverter 42. An n-channel MOSFET 44 has a drain connected to the data terminal 39, a source connected to a ground line, and a gate connected to the output of the inverter 43. The ON/OFF state of the n-channel MOSFET 44 is controlled by the output of the inverter 43.

In the output unit 38, when the p-channel MOSFET 41 is set in the OFF state and the n-channel MOSFET 44 is set in the OFF state, the data terminal 39 is set in the high-impedance condition (the opened condition). This prevents an external data bus from being driven at two voltage levels by similar semiconductor integrated circuit systems sharing the external data bus. Therefore, it is possible to prevent the flow of a large amount of short-circuit current between the semiconductor integrated circuit systems through the sharing external data bus.

Further, in the output unit 38, an n-channel MOSFET 45 has a drain connected to the input of the inverter 40, a source connected to the ground line, and a gate connected to the output of the VDDQ rising edge detecting unit 37. The n-channel MOSFET 45 is switched ON when the edge detection signal STTQ is output by the VDDQ rising edge detecting unit 37. An n-channel MOSFET 46 has a drain connected to the input of the inverter 42, a source connected to the ground line, and a gate connected to the output of the VDDQ rising edge detecting unit 37. The n-channel MOSFET 46 is switched ON when the edge detection signal STTQ is output by the VDDQ rising edge detecting unit 37.

In the above-described semiconductor integrated circuit system of FIG. 3, the source power voltage VDDQ supplied from the VDDQ power line 36 to the output unit 38 is supplied to the inverters 40, 42 and 43, the p-channel MOSFET 41, and the VDDQ rising edge detecting unit 37.

When the rising edge of the source power voltage VDD occurs upon power-up of the semiconductor integrated circuit system of the present embodiment, the edge detection signal STT is output by the VDD rising edge detecting unit 13.

When the edge detection signal STT is output by the VDD rising edge detecting unit 13, the output of the inverter 16 is set at the low level; the output of the NAND circuit 17 is set at the high level; and the output of the inverter 23 is set at the low level. At this time, the transmission gate circuit 24 is set in the ON state, and the transmission gate circuit 27 is set in the ON state.

Further, when the edge detection signal STT is output by the VDD rising edge detecting unit 13, the output enable signal (/OE) is set at the high level; the output of the NOR circuit 19 is set at the low level; the output of the inverter 20 is set at the high level; the output of the inverter 31 is set at the low level; the output of the inverter 40 is set at the high level; and the p-channel MOSFET 41 is set in the OFF state.

Further, when the edge detection signal STT is output by the VDD rising edge detecting unit 13, the output of the NOR circuit 21 is set at the low level; the output of the inverter 22 is set at the high level; the output of the inverter 34 is set at the low level; the output of the inverter 42 is set at the high level; the output of the inverter 43 is set at the low level; and the n-channel MOSFET 44 is set in the OFF state.

Accordingly, in the semiconductor integrated circuit system of the present embodiment, if the rising edge of the source power voltage VDD supplied to the output control unit 15 occurs, prior to the occurrence of the rising edge of the source power voltage VDDQ supplied to the output unit 38, upon power-up of the system, the output control unit 15 controls the output unit 38 in response to the edge detection signal STT from the VDD rising edge detecting unit 13, so that the data terminal 39 is set in the high-impedance state by the output unit 38.

On the other hand, when the rising edge of the source power voltage VDDQ occurs upon power-up of the semiconductor integrated circuit system of the present embodiment, the edge detection signal STTQ is output by the VDDQ rising edge detecting unit 37.

When the edge detection signal STTQ is output by the VDDQ rising edge detecting unit 37, the n-channel MOSFET 45 is set in the ON state; the input of the inverter 40 is set at the low level; the output of the inverter 40 is set at the high level; and the p-channel MOSFET 41 is set in the OFF state.

Further, when the edge detection signal STTQ is output by the VDDQ rising edge detecting unit 37, the n-channel MOSFET 46 is set in the ON state; the input of the inverter 42 is set at the low level; the output of the inverter 42 is set at the high level; the output of the inverter 43 is set at the low level; and the n-channel MOSFET 44 is set in the OFF state.

Accordingly, if the rising edge of the source power voltage VDDQ supplied to the output unit 38 occurs, prior to the occurrence of the rising edge of the source power voltage VDD supplied to the output control unit 15, upon power-up of the system, the edge detection signal STTQ is output by the VDDQ rising edge detecting unit 37. The p-channel MOSFET 41 is set in the OFF state and the n-channel MOSFET 44 is set in the OFF state by the edge detection signal STTQ from the VDDQ rising edge detecting unit 37. Therefore, the output unit 38 is controlled in response to the edge detection signal STTQ from the VDDQ rising edge detecting unit 37, so that the data terminal 39 is set in the high-impedance state.

Further, after the occurrence of the rising edge of the source power voltage VDD, a falling edge of the edge detection signal STT from the VDD rising edge detecting unit 13 occurs. At this time, the output of the inverter 16 is set at the high level, and the NAND circuit 17 serves as the inverter for the clock signal (/CLK) from the clock buffer 11.

Further, after the occurrence of the rising edge of the source power voltage VDDQ, a falling edge of the edge detection signal STTQ from the VDDQ rising edge detecting unit 37 occurs. At this time, the n-channel MOSFET 45 is set in the OFF state and the n-channel MOSFET 46 is set in the OFF state.

Before the start of a data output cycle in the semiconductor integrated circuit system of the present embodiment, the output enable signal (/OE) from the output enable signal generating unit 14 is set at the high level. At this time, the output of the NOR circuit 19 is set at the low level, the output of the inverter 20 is set at the high level, the output of the NOR circuit 21 is set at the low level, and the output of the inverter 22 is set at the high level.

After this, when the high level of the clock signal CLK from the clock terminal 10 occurs, the output (/CLK) of the clock buffer 11 is set at the low level; the output of the NAND circuit 17 is set at the high level; and the output of the inverter 23 is set at the low level. The transmission gate circuit 24 is set in the ON state, and the transmission gate circuit 27 is set in the ON state.

At this time, the high level at the output of the inverter 20 is latched by the latch circuit 30, the output of the inverter 31 is set at the low level, the output of the inverter 40 is set at the high level, and the p-channel MOSFET 41 is set in the OFF state. Similarly, the high level at the output of the inverter 22 is latched by the latch circuit 33, the output of the inverter 34 is set at the low level, the output of the inverter 42 is set at the high level, the output of the inverter 43 is set at the low level, and the n-channel MOSFET 44 is set in the OFF state.

Accordingly, before the start of the data output cycle, the output control unit 15 controls the output unit 38 so that the p-channel MOSFET 41 is set in the OFF state and the n-channel MOSFET 44 is set in the OFF state. The data terminal 39 is set in the high-impedance state by the output unit 38.

At the start of a data output cycle in the semiconductor integrated circuit system of the present embodiment, the output enable signal (/OE) from the output enable signal generating unit 14 is set at the low level. At this time, the NOR circuit 19 serves as the inverter for the output of the inverter 18, and the NOR circuit 21 serves as the inverter for the read-data signal (RD).

When the read-data signal (RD) is set at the high level during the data output cycle, the output of the inverter 18 is set at the low level, the output of the NOR circuit 19 is set at the high level, the output of the inverter 20 is set at the low level, the output of the NOR circuit 21 is set at the low level, and the output of the inverter 22 is set at the high level.

After this, when the high level of the clock signal (CLK) from the clock terminal 10 occurs, the output (/CLK) of the clock buffer 11 is set at the low level; the output of the NAND circuit 17 is set at the high level; and the output of the inverter 23 is set at the low level. The transmission gate circuit 24 is set in the ON state, and the transmission gate circuit 27 is set in the ON state.

At this time, the low level at the output of the inverter 20 is latched by the latch circuit 30, the output of the inverter 31 is set at the high level, the output of the inverter 40 is set at the low level, and the p-channel MOSFET 41 is set in the ON state. The high level at the output of the inverter 22 is latched by the latch circuit 33, the output of the inverter 34 is set at the low level, the output of the inverter 42 is set at the high level, the output of the inverter 43 is set at the low level, and the n-channel MOSFET 44 is set in the OFF state.

Accordingly, when the read-data signal (RD) is set at the high level during the data output cycle, the output control unit 15 controls the output unit 38 so that the p-channel MOSFET 41 is set in the ON state and the n-channel MOSFET 44 is set in the OFF state. The data (DQ) at the data terminal 39 is set in the high level by the output unit 38.

When the read-data signal (RD) is set at the low level during the data output cycle, the output of the inverter 18 is set at the high level, the output of the NOR circuit 19 is set at the low level, the output of the inverter 20 is set at the high level, the output of the NOR circuit 21 is set at the high level, and the output of the inverter 22 is set at the low level.

After this, when the high level of the clock signal (CLK) from the clock terminal 10 occurs, the output (/CLK) of the clock buffer 11 is set at the low level; the output of the NAND circuit 17 is set at the high level; and the output of the inverter 23 is set at the low level. The transmission gate circuit 24 is set in the ON state, and the transmission gate circuit 27 is set in the ON state.

At this time, the high level at the output of the inverter 20 is latched by the latch circuit 30, the output of the inverter 31 is set at the low level, the output of the inverter 40 is set at the high level, and the p-channel MOSFET 41 is set in the OFF state. The low level at the output of the inverter 22 is latched by the latch circuit 33, the output of the inverter 34 is set at the high level, the output of the inverter 42 is set at the low level, the output of the inverter 43 is set at the high level, and the n-channel MOSFET 44 is set in the ON state.

Accordingly, when the read-data signal (RD) is set at the low level during the data output cycle, the output control unit 15 controls the output unit 38 so that the p-channel MOSFET 41 is set in the OFF state and the n-channel MOSFET 44 is set in the ON state. The data (DQ) at the data terminal 39 is set at the low level by the output unit 38.

Therefore, even when one of the rising edge of the source power voltage VDDQ supplied to the output unit 38 and the rising edge of the source power voltage VDD supplied to the output control unit 15 occurs prior to the occurrence of the rising edge of the other source power voltage, it is possible for the semiconductor integrated circuit system of the present embodiment to set the data terminal 39 in the high-impedance state. It is possible to effectively prevent the flow of a large amount of short-circuit current between similar semiconductor integrated circuit systems through the sharing external data bus, so that the power consumption of the semiconductor integrated circuit system can be remarkably reduced.

Figure 6:
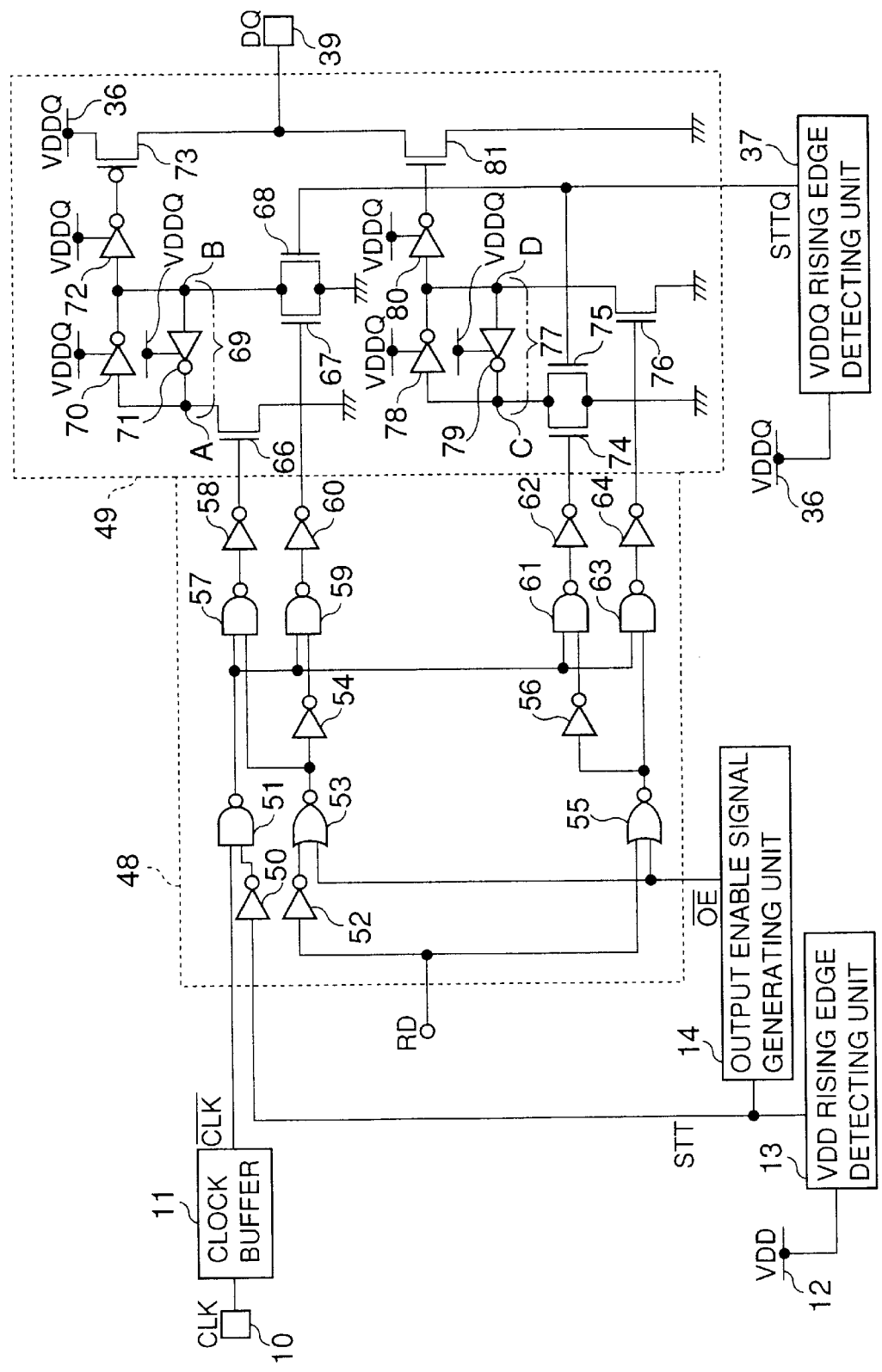
FIG. 6 is a block diagram of a semiconductor integrated circuit system in a second embodiment of the present invention.

Next, FIG. 6 shows a semiconductor integrated circuit system in a second embodiment of the present invention. The present embodiment of the semiconductor integrated circuit system is applied to the synchronous DRAM, similar to the semiconductor integrated circuit system of FIG. 3.

In the semiconductor integrated circuit system of FIG. 6, an output control unit 48 and an output unit 49 which are different from the output control unit 15 and the output unit 38 of FIG. 3 are provided. Other elements of the present embodiment are the same as corresponding elements of the previous embodiment of FIG. 3, and a description thereof will be omitted.

As shown in FIG. 6, in the output control unit 48, an inverter 50 inverts the edge detection signal STT from the VDD rising edge detecting unit 13. A NAND circuit 51 performs a NAND operation between the clock signal (/CLK) from the clock buffer 11 and the output of the inverter 50.

An inverter 52 inverts the read-data signal (RD). A NOR circuit 53 performs a NOR operation between the output of the inverter 52 and the output enable signal (/OE) from the output enable signal generating unit 14. An inverter 54 inverts the output of the NOR circuit 53.

Further, in the output control unit 48, a NOR circuit 55 performs a NOR operation between the read-data signal (RD) and the output enable signal (/OE) from the output enable signal generating unit 14. An inverter 56 inverts the output of the NOR circuit 55.

A NAND circuit 57 performs a NAND operation between the output of the NAND circuit 51 and the output of the NOR circuit 53. An inverter 58 inverts the output of the NAND circuit 57.

A NAND circuit 59 performs a NAND operation between the output of the NAND circuit 51 and the output of the inverter 54. An inverter 60 inverts the output of the NAND circuit 59.

A NAND circuit 61 performs a NAND operation between the output of the NAND circuit 51 and the output of the inverter 56. An inverter 62 inverts the output of the NAND circuit 61.

A NAND circuit 63 performs a NAND operation between the output of the NAND circuit 51 and the output of the NOR circuit 55. An inverter 64 inverts the output of the NAND circuit 63.

Similar to the output control unit 15 of FIG. 3, the output control unit 48 inputs the edge detection signal STT from the VDD rising edge detecting unit 13, the output enable signal (/OE) from the output enable signal generating unit 14, and the read-data signal (RD) from the memory core, as well as the clock signal (/CLK) from the clock buffer 11.

In the above-described system of FIG. 6, the source power voltage VDD supplied to the output control unit 48 is supplied to the inverters 50, 52, 54, 56, 58, 60, 62 and 64, the NAND circuits 51, 57, 59, 61 and 63, and the NOR circuits 53 and 55, as well as the VDD rising edge detecting unit 13.

Further, in the semiconductor integrated circuit system of FIG. 6, the output unit 49 inputs the output of the inverter 58, the output of the inverter 60, the output of the inverter 62, the output of the inverter 64, and the edge detection signal (STTQ) from the VDDQ rising edge detecting unit 37. The output unit 49 outputs the data (DQ) to the data terminal 39 at the start of a data output cycle.

In the output unit 49, a latch circuit 69 includes an inverter 70 and an inverter 71. The output of the inverter 71 and the input of the inverter 70 are connected to each other at a connection point "A". The input of the inverter 71 and the output of the inverter 70 are connected to each other at a connection point "B". An inverter 72 inverts the output of the inverter 70.

An n-channel MOSFET 66 has a source connected to a ground line, a gate connected to the output of the inverter 58, and a drain connected to the output (or the connection point "A") of the inverter 71. The ON/OFF state of the n-channel MOSFET 66 is controlled by the output of the inverter 58.

An n-channel MOSFET 67 has a source connected to the ground line, a gate connected to the output of the inverter 60, and a drain connected to the output (or the connection point "B") of the inverter 70. The ON/OFF state of the n-channel MOSFET 67 is controlled by the output of the inverter 60.

An n-channel MOSFET 68 has a source connected to the ground line, a gate connected to the output of the VDDQ rising edge detecting unit 37, and a drain connected to the output (or the connection point "B") of the inverter 70. The ON/OFF state of the n-channel MOSFET 68 is controlled by the output of the VDDQ rising edge detecting unit 37. The n-channel MOSFET 68 is a switch element which is set in the ON state when the edge detection signal STTQ is output by the VDDQ rising edge detecting unit 37.

A p-channel MOSFET 73 has a source connected to the VDDQ source power line 36, a gate connected to the output of the inverter 72, and a drain connected to the data terminal 39. The ON/OFF state of the p-channel MOSFET 73 is controlled by the output of the inverter 72.

A latch circuit 77 includes an inverter 78 and an inverter 79. The output of the inverter 79 and the input of the inverter 78 are connected to each other at a connection point "C". The input of the inverter 79 and the output of the inverter 78 are connected to each other at a connection point "D". An inverter 80 inverts the output of the inverter 78.

An n-channel MOSFET 74 has a source connected to the ground line, a gate connected to the output of the inverter 62, and a drain connected to the output (or the connection point "C") of the inverter 79. The ON/OFF state of the n-channel MOSFET 74 is controlled by the output of the inverter 62.

An n-channel MOSFET 75 has a source connected to the ground line, a gate connected to the output of the VDDQ rising edge detecting unit 37, and a drain connected to the output (or the connection point "C") of the inverter 79. The ON/OFF state of the n-channel MOSFET 75 is controlled by the output of the VDD rising edge detecting unit 37. The n-channel MOSFET 75 is a switch element which is set in the ON state when the edge detection signal STTQ is output by the VDDQ rising edge detecting unit 37.

An n-channel MOSFET 76 has a source connected to the ground line, a gate connected to the output of the inverter 64, and a drain connected to the output (or the connection point "D") of the inverter 78. The ON/OFF state of the n-channel MOSFET 76 is controlled by the output of the inverter 64.

A p-channel MOSFET 81 has a source connected to the ground line, a gate connected to the output of the inverter 80, and a drain connected to the data terminal 39. The ON/OFF state of the p-channel MOSFET 81 is controlled by the output of the inverter 80.

In the above-described semiconductor integrated circuit system of FIG. 6, the source power voltage VDDQ from the VDDQ power line 36 is supplied to the inverters 70, 71, 72, 78, 79 and 80, the p-channel MOSFET 73, and the VDDQ rising edge detecting unit 37.

When the rising edge of the source power voltage VDD occurs upon power-up of the semiconductor integrated circuit system of the present embodiment, the edge detection signal STT is output by the VDD rising edge detecting unit 13.

When the edge detection signal STT is output by the VDD rising edge detecting unit 13, the output of the inverter 50 is set at the low level, and the output of the NAND circuit 51 is set at the high level. At this time, the NAND circuit 57 serves as the inverter for the output of the NOR circuit 53; the NAND circuit 59 serves as the inverter for the output of the inverter 54; the NAND circuit 61 serves as the inverter for the output of the inverter 56; and the NAND circuit 63 serves as the inverter for the output of the NOR circuit 55.

Further, when the edge detection signal STT is output by the VDD rising edge detecting unit 13, the output enable signal (/OE) is set at the high level; the output of the NOR circuit 53 is set at the low level; the output of the NAND circuit 57 is set at the high level; the output of the inverter 58 is set at the low level; and the n-channel MOSFET 66 is set in the OFF state. The output of the inverter 54 is set at the high level; the output of the NAND circuit 59 is set at the low level; the output of the inverter 60 is set at the high level; and the n-channel MOSFET 67 is set in the ON state.

Therefore, at this time, the input of the inverter 72 is set at the low level; the output of the inverter 72 is set at the high level; and the p-channel MOSFET 73 is set in the OFF state.

Further, when the edge detection signal STT is output by the VDD rising edge detecting unit 13, the output of the NOR circuit 55 is set at the low level; the output of the inverter 56 is set at the high level; the output of the NAND circuit 61 is set at the low level; the output of the inverter 62 is set at the high level; and the n-channel MOSFET 74 is set in the ON state. The output of the NAND circuit 63 is set at the high level; the output of the inverter 64 is set at the low level; and the n-channel MOSFET 76 is set in the OFF state.

Therefore, at this time, the input of the inverter 78 is set at the low level; the output of the inverter 78 is set at the high level; the output of the inverter 80 is set at the low level; and the n-channel MOSFET 81 is set in the OFF state.

Accordingly, in the semiconductor integrated circuit system of the present embodiment, if the rising edge of the source power voltage VDD supplied to the output control unit 48 occurs, prior to the occurrence of the rising edge of the source power voltage VDDQ supplied to the output unit 49, upon power-up of the system, the output control unit 48 controls the output unit 49 in response to the edge detection signal STT and the output enable signal /OE so that the p-channel MOSFET 73 is set in the OFF state and the n-channel MOSFET 81 is set in the OFF state. Thus, the output control unit 48 controls the output unit 49 so that the data terminal 39 is set in the high-impedance state by the output unit 49.

On the other hand, when the rising edge of the source power voltage VDDQ occurs upon power-up of the semiconductor integrated circuit system of the present embodiment, the edge detection signal STTQ is output by the VDDQ rising edge detecting unit 37.

When the edge detection signal STTQ is output by the VDDQ rising edge detecting unit 37, the n-channel MOSFET 68 is set in the ON state; the input of the inverter 72 is set at the low level; the output of the inverter 72 is set at the high level; and the p-channel MOSFET 73 is set in the OFF state.

Further, when the edge detection signal STTQ is output by the VDDQ rising edge detecting unit 37, the n-channel MOSFET 75 is set in the ON state; the input of the inverter 78 is set at the low level; the output of the inverter 78 is set at the high level; the output of the inverter 80 is set at the low level; and the n-channel MOSFET 81 is set in the OFF state.

Accordingly, if the rising edge of the source power voltage VDDQ supplied to the output unit 49 occurs, prior to the occurrence of the rising edge of the source power voltage VDD supplied to the output control unit 48, upon power-up of the system, the edge detection signal STTQ is output by the VDDQ rising edge detecting unit 37. The control unit 48 is controlled by the edge detection signal STTQ from the VDDQ rising edge detecting unit 37 so that the p-channel MOSFET 73 is set in the OFF state and the n-channel MOSFET 81 is set in the OFF state. Thus, the output unit 48 is controlled in response to the edge detection signal STTQ from the VDDQ rising edge detecting unit 37, so that the data terminal 39 is set in the high-impedance state.

Further, after the occurrence of the rising edge of the source power voltage VDD, a falling edge of the edge detection signal STT occurs. At this time, the output of the inverter 50 is set at the high level, and the NAND circuit 51 serves as the inverter for the clock signal (/CLK) from the clock buffer 11.

Further, after the occurrence of the rising edge of the source power voltage VDDQ, a falling edge of the edge detection signal STTQ occurs. At this time, the n-channel MOSFET 68 is set in the OFF state and the n-channel MOSFET 75 is set in the OFF state.

Before the start of a data output cycle in the semiconductor integrated circuit system of the present embodiment, the output enable signal (/OE) from the output enable signal generating unit 14 is set at the high level. At this time, the output of the NOR circuit 53 is set at the low level, the output of the inverter 54 is set at the high level, the output of the NOR circuit 55 is set at the low level, and the output of the inverter 56 is set at the high level.

When the high level of the clock signal CLK from the clock terminal 10 occurs, the output (/CLK) of the clock buffer 11 is set at the low level; and the output of the NAND circuit 51 is set at the high level.

At this time, the output of the NAND circuit 57 is set at the high level, the output of the inverter 58 is set at the low level, and the n-channel MOSFET 66 is set in the OFF state. The output of the NAND circuit 59 is set at the low level, the output of the inverter 60 is set at the high level, and the n-channel MOSFET 67 is set in the ON state.

The input of the inverter 72 is set at the low level, the output of the inverter 72 is set at the high level, and the p-channel MOSFET 73 is set in the OFF state.

Further, the output of the NAND circuit 61 is set at the low level, the output of the inverter 62 is set at the high level, and the n-channel MOSFET 74 is set in the ON state. The output of the NAND circuit 63 is set at the high level, the output of the inverter 64 is set at the low level, and the n-channel MOSFET 76 is set in the OFF state.

The input of the inverter 78 is set at the low level, the output of the inverter 78 is set at the high level, the output of the inverter 80 is set at the low level, and the n-channel MOSFET 81 is set in the OFF state.

Accordingly, before the start of the data output cycle, the output control unit 48 controls the output unit 49 so that the p-channel MOSFET 73 is set in the OFF state and the n-channel MOSFET 81 is set in the OFF state. The data terminal 39 is set in the high-impedance state by the output unit 49.

At the start of a data output cycle in the semiconductor integrated circuit system of the present embodiment, the output enable signal (/OE) from the output enable signal generating unit 14 is set at the low level. At this time, the NOR circuit 53 serves as the inverter for the output of the inverter 52, and the NOR circuit 55 serves as the inverter for the read-data signal (RD).

When the read-data signal (RD) is set at the high level during the data output cycle, the output of the inverter 52 is set at the low level, the output of the NOR circuit 53 is set at the high level, the output of the inverter 54 is set at the low level, the output of the NOR circuit 55 is set at the low level, and the output of the inverter 56 is set at the high level.

When the high level of the clock signal (CLK) from the clock terminal 10 occurs, the output (/CLK) of the clock buffer 11 is set at the low level, and the output of the NAND circuit 51 is set at the high level.

At this time, the output of the NAND circuit 57 is set at the low level, the output of the inverter 58 is set at the high level, and the n-channel MOSFET 66 is set in the ON state. The output of the NAND circuit 59 is set at the high level, the output of the inverter 60 is set at the low level, and the n-channel MOSFET 67 is set in the OFF state.

The input of the inverter 70 is set at the low level, the output of the inverter 70 is set at the high level, the output of the inverter 72 is set at the low level, and the p-channel MOSFET 73 is set in the ON state.

Further, the output of the NAND circuit 61 is set at the low level, the output of the inverter 62 is set at the high level, and the n-channel MOSFET 74 is set in the ON state. The output of the NAND circuit 63 is set at the high level, the output of the inverter 64 is set at the low level, and the n-channel MOSFET 76 is set in the OFF state.

The input of the inverter 78 is set at the low level, the output of the inverter 78 is set at the high level, the output of the inverter 80 is set at the low level, and the n-channel MOSFET 81 is set in the OFF state.

Accordingly, when the read-data signal (RD) is set at the high level during the data output cycle, the output control unit 48 controls the output unit 49 so that the p-channel MOSFET 73 is set in the ON state and the n-channel MOSFET 81 is set in the OFF state. Therefore, the data (DQ) at the data terminal 39 is set in the high level by the output unit 49.

On the other hand, when the read-data signal (RD) is set at the low level during the data output cycle, the output of the inverter 52 is set at the high level, the output of the NOR circuit 53 is set at the low level, the output of the inverter 54 is set at the high level, the output of the NOR circuit 55 is set at the high level, and the output of the inverter 56 is set at the low level.

When the high level of the clock signal (CLK) from the clock terminal 10 occurs, the output (/CLK) of the clock buffer 11 is set at the low level; and the output of the NAND circuit 51 is set at the high level.

At this time, the output of the NAND 57 is set at the high level, the output of the inverter 58 is set at the low level, and the n-channel MOSFET 66 is set in the OFF state. The output of the NAND circuit 59 is set at the low level, the output of the inverter 60 is set at the high level, and the n-channel MOSFET 67 is set in the ON state.

The input of the inverter 72 is set at the low level, the output of the inverter 72 is set at the high level, and the p-channel MOSFET 73 is set in the OFF state.

Further, the output of the NAND circuit 61 is set at the high level, the output of the inverter 62 is set at the low level, and the n-channel MOSFET 74 is set in the OFF state. The output of the NAND circuit 63 is set at the low level, the output of the inverter 64 is set at the high level, and the n-channel MOSFET 76 is set in the ON state.

The input of the inverter 80 is set at the low level, the output of the inverter 80 is set at the high level, and the n-channel MOSFET 81 is set in the ON state.

Accordingly, when the read-data signal (RD) is set at the low level during the data output cycle, the output control unit 48 controls the output unit 49 so that the p-channel MOSFET 73 is set in the OFF state and the n-channel MOSFET 81 is set in the ON state. The data (DQ) at the data terminal 39 is set at the low level by the output unit 49.

In the above-described semiconductor integrated circuit system of FIG. 6, even when one of the rising edge of the source power voltage VDDQ supplied to the output unit 49 and the rising edge of the source power voltage VDD supplied to the output control unit 48 occurs prior to the occurrence of the rising edge of the other source power voltage, it is possible to set the data terminal 39 in the high-impedance state. It is possible to effectively prevent the flow of a large amount of short-circuit current between similar semiconductor integrated circuit systems through the sharing external data bus, so that the power consumption of the semiconductor integrated circuit system can be remarkably reduced.

Further, in the above-described embodiment of FIG. 6, the latch circuits 69 and 77 are provided, and the high-impedance state of the data terminal 39 can be maintained for a relatively long period. Therefore, under circumstances where the difference in time between the occurrence of the rising edge of the source power voltage VDD and the occurrence of the rising edge of the source power voltage VDDQ is relatively great, the semiconductor integrated circuit system of the embodiment of FIG. 6 is useful and it is possible to effectively prevent the flow of a large amount of short-circuit current between similar semiconductor integrated circuit systems through the sharing external data bus.

The present invention may be applied to a semiconductor integrated circuit system having a voltage down converter which supplies a divided voltage of the source power voltage VDD to the internal units other than the output unit. In such a system, the output unit and the internal units are operated at the divided voltage which is lower than the source power voltage VDD. Further, the present invention may be applied to a semiconductor integrated circuit system utilizing two levels of the source power voltages VDD and VDDQ in which, for example, the source power voltage VDD level is lower than the source power voltage VDDQ level.

Further, the present invention is not limited to the above-described embodiments, and variations and modifications may be made without departing from the scope of the present invention.

What is claimed is:

1. A semiconductor integrated circuit comprising:

a first power line for supplying a first power source voltage;

a second power line for supplying a second power source voltage;

a first edge detecting circuit for outputting a first edge detection signal when a rising edge of the first power source voltage is detected;

a second edge detecting circuit for outputting a second edge detection signal when a rising edge of the second power source voltage is detected;

an output circuit connected to the first power line for outputting a signal to an output terminal in a signal output period, and for setting the output terminal in a high-impedance state in response to the first edge detection signal; and an output control circuit connected to the second power line for transmitting the signal to the output circuit in the signal output period, and for controlling the output circuit in response to the second edge detection signal, so that the output terminal is set in the high-impedance state.

2. A semiconductor integrated circuit comprising:

a first power terminal for supplying a first power source voltage;

a second power terminal for supplying a second power source voltage;

a first edge detecting circuit for outputting a first edge detection signal when a rising edge of the first power source voltage is detected;

a second edge detecting circuit for outputting a second edge detection signal when a rising edge of the second power source voltage is detected;

an output circuit for outputting a signal to an output terminal during a signal output period, and for setting the output terminal in a high-impedance state in response to the first edge detection signal when the first power source voltage begins to be supplied to the output circuit; and an output control circuit for transmitting the signal to the output circuit during the signal output period, and for controlling the output circuit in response to the second edge detection signal when the second power source voltage begins to be supplied to the output control circuit, so that the output terminal is set in the high-impedance state by the output circuit.

3. The semiconductor integrated circuit according to claim 2, wherein said output circuit comprises:

a first inverter having an input receiving a first output control signal from the output control circuit, the first power source voltage being supplied to the first inverter; and a p-channel metal oxide semiconductor field-effect transistor having a source connected to a first power line connected to the first power terminal, a drain connected to the output terminal, and a gate connected to an output of the first inverter.

4. The semiconductor integrated circuit according to claim 3, wherein said output circuit further comprises:

a second inverter having an input receiving a second output control signal from the output control circuit, the first power source voltage being supplied to the second inverter;

a third inverter having an input connected to an output of the second inverter, the first power source voltage being supplied to the third inverter; and an n-channel metal oxide semiconductor field-effect transistor having a drain connected to the output terminal, a source connected to a ground line, and a gate connected to an output of the third inverter.

5. The semiconductor integrated circuit according to claim 4, wherein said output circuit further comprises:

a first switch having a first terminal connected to the input of the first inverter, a second terminal connected to the ground line, and a third terminal connected to the first edge detecting circuit, said first switch being set in an ON state in response to the first edge detection signal output by the first edge detecting circuit.

6. The semiconductor integrated circuit according to claim 5, wherein said output circuit further comprises:

a second switch having a first terminal connected to the input of the second inverter, a second terminal connected to the ground line, and a third terminal connected to the first edge detecting circuit, the second switch being set in an ON state in response to the first edge detection signal output by the first edge detecting circuit.

7. The semiconductor integrated circuit according to claim 2, wherein said output circuit comprises:

a first inverter having an input receiving a first output control signal from the output control circuit, the first power source voltage being supplied to the first inverter;

a p-channel metal oxide semiconductor field-effect transistor having a source connected to a first power line connected to the first power terminal, a drain connected to the output terminal, and a gate connected to an output of the first inverter;

a second inverter having an input receiving a second output control signal from the output control circuit, the first power source voltage being supplied to the second inverter;

a third inverter having an input connected to an output of the second inverter, the first power source voltage being supplied to the third inverter;

a n-channel metal oxide semiconductor field-effect transistor having a drain connected to the output terminal, a source connected to a ground line, and a gate connected to an output of the third inverter;

a first switch having a first terminal connected to the input of the first inverter, a second terminal connected to the ground line, and a third terminal connected to the first edge detecting circuit, the first switch being set in an ON state in response to the first edge detection signal output by the first edge detecting circuit; and a second switch having a first terminal connected to the input of the second inverter, a second terminal connected to the ground line, and a third terminal connected to the first edge detecting circuit, the second switch being set in an ON state in response to the first edge detection signal output by the first edge detecting circuit.

8. The semiconductor integrated circuit according to claim 2, wherein said output circuit comprises:

a first switch having a first terminal connected to a ground line, a second terminal receiving a first output control signal from the output control circuit, and a third terminal, said first switch being set in one of an ON state and an OFF state in response to the first output control signal.

9. The semiconductor integrated circuit according to claim 8, wherein said output circuit further comprises:

a first inverter having an input connected to the third terminal of the first switch, the first power source voltage being supplied to the first inverter;

a second inverter having an input connected to an output of the first inverter, and an output connected to the input of the first inverter, the first power source voltage being supplied to the first inverter;

a third inverter having an input connected to the output of the first inverter, the first power source voltage being supplied to the third inverter; and a second switch having a first terminal connected to the input of the third inverter, a second terminal connected to the ground line, and a third terminal receiving a second output control signal from the output control circuit, the second switch being set in one of an ON state and an OFF state in response to the second output control signal.

10. The semiconductor integrated circuit according to claim 9, wherein said output circuit further comprises:

a p-channel metal oxide semiconductor field-effect transistor having a source connected to a first power line connected to the first power terminal, a drain connected to the output terminal, and a gate connected to an output of the third inverter.

11. The semiconductor integrated circuit according to claim 10, wherein said output circuit further comprises:

a third switch having a first terminal connected to the ground line, a second terminal receiving a third output control signal from the output control circuit, and a third terminal, said third switch being set in one of an ON state and an OFF state in response to the third output control signal.

12. The semiconductor integrated circuit according to claim 11, wherein said output circuit further comprises:

a fourth inverter having an input connected to the third terminal of the third switch, the first power source voltage being supplied to the fourth inverter;

a fifth inverter having an input connected to an output of the fourth inverter, and an output connected to the input of the fourth inverter, the first power source voltage being supplied to the fifth inverter;

an sixth inverter having an input connected to the output of the fifth inverter, the first power source voltage being supplied to the sixth inverter; and a fourth switch having a first terminal connected to the input of the sixth inverter, a second terminal connected to the ground line, and a third terminal receiving a fourth output control signal from the output control circuit, said fourth switch being set in one of an ON state and an OFF state in response to the fourth output control signal.

13. The semiconductor integrated circuit according to claim 12, wherein said output circuit further comprises:

an n-channel metal oxide semiconductor field-effect transistor having a source connected to the ground line, a drain connected to the output terminal, and a gate connected to an output of the sixth inverter.

14. The semiconductor integrated circuit according to claim 13, wherein said output circuit further comprises:

a fifth switch having a first terminal connected to the input of the third inverter, a second terminal connected to the ground line, and a third terminal connected to the first edge detecting circuit, said fifth switch being set in an ON state in response to the first edge detection signal.

15. The semiconductor integrated circuit according to claim 14, wherein said output circuit further comprises:

a sixth switch having a first terminal connected to the input of the sixth inverter, a second terminal connected to the ground line, and a third terminal connected to the first edge detecting circuit, said sixth switch being set in an ON state in response to the first edge detection signal.

16. The semiconductor integrated circuit according to claim 2, wherein said output circuit comprises:

a first switch having a first terminal connected to a ground line, a second terminal receiving a first output control signal from the output control circuit, and a third terminal, said first switch being set in one of an ON state and an OFF state in response to the first output control signal;

a first inverter having an input connected to the third terminal of the first switch, the first power source voltage being supplied to the second inverter;

a second inverter having an input connected to an output of the first inverter, and an output connected to the input of the first inverter, the first power source voltage being supplied to the second inverter;

a third inverter having an input connected to the output of the first inverter, the first power source voltage being supplied to the third inverter;

a second switch having a first terminal connected to the input of the third inverter, a second terminal connected to the ground line, and a third terminal receiving a second output control signal from the output control circuit, the second switch being set in one of an ON state and an OFF state in response to the second output control signal;

a p-channel metal oxide semiconductor field-effect transistor having a source connected to a first power line connected to the first power terminal, a drain connected to the output terminal, and a gate connected to an output of the third inverter;

a third switch having a first terminal connected to the ground line, a second terminal receiving a third output control signal from the output control circuit, and a third terminal, said third switch being set in one of an ON state and an OFF state in response to the third output control signal;

a fourth inverter having an input connected to the third terminal of the third switch, the first power source voltage being supplied to the fourth inverter;

a fifth inverter having an input connected to an output of the fourth inverter, and an output connected to the input of the fourth inverter, the first power source voltage being supplied to the fifth inverter;

a sixth inverter having an input connected to the output of the fifth inverter, the first power source voltage being supplied to the sixth inverter;

a fourth switch having a first terminal connected to the input of the sixth inverter, a second terminal connected to the ground line, and a third terminal receiving a fourth output control signal from the output control circuit, said fourth switch being set in one of an ON state and an OFF state in response to the fourth output control signal;

an n-channel metal oxide semiconductor field-effect transistor having a source connected to the ground line, a drain connected to the output terminal, and a gate connected to an output of the sixth inverter;

a fifth switch having a first terminal connected to the input of the third inverter, a second terminal connected to the ground line, and a third terminal connected to the first edge detecting circuit, said fifth switch being set in an ON state in response to the first edge detection signal; and a sixth switch having a first terminal connected to the input of the sixth inverter, a second terminal connected to the ground line, and a third terminal connected to the first edge detecting circuit, said sixth switch being set in an ON state in response to the first edge detection signal.

* * * * *